(12) United States Patent
Ismail et al.

(10) Patent No.: US 10,966,318 B2
(45) Date of Patent: Mar. 30, 2021

(54) COMPONENT CARRIER WITH ELECTRICALLY RELIABLE BRIDGE WITH SUFFICIENTLY THICK VERTICAL THICKNESS IN THROUGH HOLE OF THIN DIELECTRIC

(71) Applicant: AT&S Austria Technologie & Systemtechnik Aktiengesellschaft, Leoben (AT)

(72) Inventors: Ismadi Bin Ismail, Kuching (MY); Valerian Yun Khim Chung, Kuching (MY); Alex Yucun Dou, Shanghai (CN); Seok Kim Tay, Singapore (SG)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/777,493

(22) Filed: Jan. 30, 2020

(65) Prior Publication Data
US 2020/0253053 A1   Aug. 6, 2020

(30) Foreign Application Priority Data
Jan. 31, 2019   (CN) .......................... 201910101365.6

(51) Int. Cl.
*H05K 1/11*   (2006.01)
*H05K 1/18*   (2006.01)
(Continued)

(52) U.S. Cl.
CPC ............... *H05K 1/115* (2013.01); *H05K 1/09* (2013.01); *H05K 1/182* (2013.01); *H05K 3/0026* (2013.01);
(Continued)

(58) Field of Classification Search
CPC ........ H05K 1/115; H05K 3/0026; H05K 3/42; H05K 2201/09827; H05K 2201/09854; H05K 2201/09736; H05K 2201/09727
(Continued)

(56) References Cited

U.S. PATENT DOCUMENTS

2008/0203420 A1* 8/2008 Higaki .................... H01L 33/62
257/99
2009/0001396 A1* 1/2009 Higaki .................... H01L 33/62
257/98
(Continued)

FOREIGN PATENT DOCUMENTS

JP   2006310779 A   11/2006
JP   2011210794 A   10/2011
(Continued)

*Primary Examiner* — Sherman Ng
(74) *Attorney, Agent, or Firm* — Robert A. Blaha; Smith Tempel Blaha LLC

(57) ABSTRACT

A component carrier includes an electrically insulating layer structure having a first main surface and a second main surface with a through hole extending through the electrically insulating layer structure between the first main surface and the second main surface. An electrically conductive bridge structure connects opposing sidewalls of the electrically insulating layer structure delimiting the through hole. A vertical thickness of the electrically insulating layer structure is not more than 200 μm and a narrowest vertical thickness of the bridge structure is at least 20 μm.

18 Claims, 2 Drawing Sheets

(51) Int. Cl.
  *H05K 1/09* (2006.01)
  *H05K 3/00* (2006.01)
  *H05K 3/42* (2006.01)
(52) U.S. Cl.
  CPC ....... *H05K 3/42* (2013.01); *H05K 2201/0323* (2013.01); *H05K 2201/09727* (2013.01); *H05K 2201/09736* (2013.01); *H05K 2201/09827* (2013.01); *H05K 2201/09854* (2013.01); *H05K 2203/107* (2013.01)
(58) Field of Classification Search
  USPC ........................................................ 174/262
  See application file for complete search history.

(56) References Cited

U.S. PATENT DOCUMENTS

| | | | | |
|---|---|---|---|---|
| 2014/0097013 | A1* | 4/2014 | Hara | H05K 1/115 |
| | | | | 174/266 |
| 2014/0154463 | A1* | 6/2014 | Liang | H05K 3/0032 |
| | | | | 428/131 |
| 2016/0330836 | A1* | 11/2016 | Mizutani | H05K 3/187 |
| 2017/0354034 | A1* | 12/2017 | Hitsuoka | H05K 3/423 |

FOREIGN PATENT DOCUMENTS

| | | |
|---|---|---|
| JP | 2015060981 A | 3/2015 |
| JP | 2016018831 A | 2/2016 |

\* cited by examiner

COMPONENT CARRIER WITH ELECTRICALLY RELIABLE BRIDGE WITH SUFFICIENTLY THICK VERTICAL THICKNESS IN THROUGH HOLE OF THIN DIELECTRIC

CROSS-REFERENCE TO RELATED APPLICATION

This application claims priority to Chinese Patent Application No. 201910101365.6 filed Jan. 31, 2019, the disclosure of which is hereby incorporated herein by reference.

TECHNICAL FIELD

Embodiments of the invention relate to a component carrier and a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently contact electrically conductive layer structures and/or components embedded in a component carrier with proper quality. Formation of mechanical vias and laser vias, which may be copper filled, may be advantageous for this and other purposes.

SUMMARY

There may be a need to manufacture a component carrier with proper electric reliability.

According to an exemplary embodiment of the invention, a component carrier is provided which comprises an electrically insulating layer structure having a first main surface and a second main surface, a through hole (in particular a laser through hole) extending through the electrically insulating layer structure between the first main surface and the second main surface, and an electrically conductive bridge structure connecting opposing side-walls of the electrically insulating layer structure delimiting the through hole, wherein a vertical thickness of the electrically insulating layer structure is not more than 200 µm and a narrowest vertical thickness of the bridge structure is at least 20 µm.

According to another exemplary embodiment of the invention, a meth-od of manufacturing a component carrier is provided, wherein the method comprises forming a through hole extending between a first main surface and a second main surface of an electrically insulating layer structure, and forming an electrically conductive bridge structure connecting opposing sidewalls of the electrically insulating layer structure delimiting the through hole, wherein a vertical thickness of the electrically insulating layer structure is not more than 200 µm and a narrowest vertical thickness of the bridge structure is at least 20 µm.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "through hole" may particularly denote a hole extending completely through an entire electrically insulating layer structure, and which may be formed in particular and preferably by laser processing. Thus, the through hole may be a laser through hole. Such a through hole may have, for example, two opposing tapering portions extending from the two opposing main surfaces of the electrically insulating layer structure. A through hole may be manufactured for instance by a combination of laser shots from the front side and the back side, i.e. from the two opposing main surfaces of, the electrically insulating layer structure. One or more laser shots may be performed from each of these sides. Formation of a through hole by laser processing from only one main surface may be possible as well. Furthermore, formation of a through hole may be carried out as well by other methods than laser processing, for instance by a plasma treatment.

In the context of the present application, the term "bridge structure" may particularly denote an electrically conductive structure extending substantially horizontally between opposing sidewalls of the electrically insulating layer structure and delimiting the through hole, in particular at or close to a narrowest portion of the through hole. For instance, such a bridge structure can be formed by plating following through hole formation. After such a plating procedure, the previously formed through hole is only partially filled with electrically conductive material constituting the bridge structure, so that the bridge structure may be delimited in an upward direction by a first demarcation surface and at a lower side by a second demarcation surface. Both the first demarcation surface and the second demarcation surface may have a concave shape.

According to an exemplary embodiment of the invention, a manufacturing method for manufacturing a component carrier is provided in which a through hole at least partially filled with electrically conductive material can be manufactured in such a way that the component carrier has a high reliability. This reliability occurs in terms of electric reliability, so that any undesired interruption of an electrical path extending along the through hole filled with electrically conductive material can be prevented. The reliability is also related to mechanical reliability, since the mentioned design rules for manufacturing the through hole including its electrically conductive filling does not result in cracks disturbing performance of the component carrier. Furthermore, also a proper thermal reliability may be achieved with the manufactured component carrier, since even in the presence of significant temperature changes, the reliable electrically conductive filling of the through hole will be maintained. It has turned out that in particular component carriers with through holes in thin electrically insulating layer structures of 200 µm thickness or less are specifically prone to reliability issues. This appears to be due to the shape of a through hole extending entirely through such thin electrically insulating layer structures such as thin cores. However, it has been surprisingly found that when the narrowest vertical thickness of the bridge structure connecting opposing sidewalls of the electrically insulating layer structure delimiting the through hole is 20 µm or more, no such reliability issues occur any more, even when forming the through hole in a thin electrically insulating layer structure with a thickness of not more than 200 µm. Thus, the mentioned design rule significantly improves the reliability of copper filed laser vias in thin cores.

In the following, further exemplary embodiments of the component carrier and the method will be explained.

In an embodiment, the component carrier may comprise a first electrically conductive layer structure on the first main surface, and a second electrically conductive layer structure on the second main surface. For instance, the electrically conductive layer structures may be patterned electrically conductive layer structures. The method may be adapted correspondingly.

In another embodiment, the method comprises forming the through hole in the electrically insulating layer structure while one or both of the main surfaces of the electrically insulating layer structure is or are not covered by an electrically conductive layer structure. In such an embodiment (in which electrically conductive layer structures on one or both of the opposing main surfaces of the electrically insulating layer structure may be dispensable), the through hole may be drilled directly through the electrically insulating layer structure alone.

In an embodiment, a vertical thickness of the electrically insulating layer structure may be not more than 140 µm, in particular no more than 110 µm. It may even be possible that the vertical thickness of the electrically insulating layer structure is in a range between 40 µm and 60 µm. Thus, even when the thickness of the electrically insulating layer structure through which the through hole extends vertically is extremely small, as it may occur in modern component carrier applications, respecting the design rule of a minimum vertical thickness of the electrically conductive bridge structure of 20 µm or more may still ensure reliability of the component carrier.

In an embodiment, a narrowest vertical thickness of the bridge structure is at least 25 µm. It has turned out that when the vertical thickness of the bridge structure is 25 µm or more, an even better reliability behavior can be obtained. Thus, a minimum vertical thickness of 25 µm is preferred, although not absolutely necessary.

In an embodiment, a narrowest vertical thickness of the bridge structure is not more than 40 µm. It has also been surprisingly found that when the vertical thickness of the bridge structure becomes too large, dimples or concave surfaces delimiting the bridge structure as an upper demarcation surface and a lower demarcation surface may become excessively shallow. This may cause issues when subsequently filling one or both dimples with electrically conductive material (such as copper) by plating, since it may have the tendency to cause an undesired shape of the copper filled laser via. Therefore, it is preferred that an upper limit of the narrowest vertical thickness of the bridge structure of not more than 40 µm.

In an embodiment, a narrowest horizontal width of the through hole is not less than 30 µm, in particular not less than 45 µm. It has been surprisingly found that also the minimum horizontal width of the through hole is an important design parameter for obtaining proper reliability of a component carrier having a through hole being at least partially filled with electrically conductive filling medium. Furthermore, in particular for thin cores with a thickness of not more than 200 µm, keeping the narrowest part of the through hole (and therefore a narrowest width of the bridge structure being present in this narrowest portion of the through hole) at or above 30 µm, preferably at or above 45 µm, may have a further positive impact on the reliability. A complete filling of even this narrowest portion of the through hole can then be guaranteed. This has a positive impact on both electrical as well mechanical reliability of the manufactured component carrier. When the mentioned design rules are respected, a risk of cracks may be significantly suppressed.

In an embodiment, a narrowest horizontal width of the through hole is not more than 100 µm, in particular not more than 75 µm. It has also been found that the narrowest horizontal width of the through hole and correspondingly the bridge structure filling the through hole usually at the narrowest portion thereof should not exceed 100 µm for a thin electrically insulating layer structure of not more than 200 µm thickness. An upper limit of 75 µm for the narrowest horizontal width of the through hole is even more preferred. It has been found that bridge formation may be disturbed during a plating procedure when the mentioned values are significantly exceeded.

In an embodiment, the component carrier comprises a first electrically conductive bulk structure filling at least part of a volume between the electrically conductive bridge structure and the first main surface. After formation of the bridge structure (preferably by plating following a previous seed layer formation), the remaining dimples or recesses above the upper demarcation surface of the bridge structure may be filled partially or entirely with further electrically conductive material such as copper, thereby forming the first electrically conductive bulk structure above the upper demarcation surface of the bridge structure. It is known by a skilled person that, in a cross-section of a component carrier, the first demarcation surface between bridge structure and first bulk structure is properly visible. At least partially filling the volume of the through hole above the upper demarcation surface of the bridge structure with the first electrically conductive bulk structure may further improve electric reliability of the manufactured component carrier. For instance, the first electrically conductive bulk structure may be formed by a separate plating procedure following and being separately from a previous plating procedure for forming the bridge structure.

In an embodiment, the first electrically conductive bulk structure has a first dip which may be located substantially at the level of the first main surface. For instance, the first dip may have a depth of less than 15 µm. When the recess above the first demarcation surface of the bridge structure is filled only partially with the first electrically conductive bulk structure, a dip or dimple may remain. It has turned out that, with the mentioned thin core of less than 200 µm, a maximum depth of 15 µm of this first dip should not be exceeded. The robustness of the copper filled laser via having a first dip with a depth below 15 µm against formation of cracks and other phenomena reducing reliability can be significantly improved.

In an embodiment, the first electrically conductive bulk structure is composed of a plurality of first plating layers formed in subsequent first plating stages. Forming the first electrically conductive bulk structure so that the largest parts of the dimple above the upper demarcation surface of the bridge structure is filled with electrically conductive material can be accomplished by carrying out a number of subsequent plating procedures. A skilled person will understand that the individual plating layers constituting together the first electrically conductive bulk structure can be properly distinguished visibly when analyzing a cross-section of a component carrier. Carrying out a sequence of multiple plating structures is therefore a further measure for increasing reliability of the obtained component carrier.

In an embodiment, the component carrier comprises a second electrically conductive bulk structure filling at least part of a volume between the electrically conductive bridge structure and the second main surface. Furthermore, the second electrically conductive bulk structure may have a second dip which may be located substantially at the level of the second main surface. For instance, the second dip may have a depth of less than 15 µm. The second electrically conductive bulk structure can be composed of a plurality of second plating layers formed in subsequent second plating stages. As described above for the first electrically conductive bulk structure, also the second electrically conductive bulk structure can be made subject to the described design rules for further increasing reliability of the manufactured component carrier. At least partially filling the dimple below the second demarcation surface defining the bottom end of the bridge structure by material of the second electrically conductive bulk structure is highly advantageous, in particular when a remaining second dip at a bottom side is also below 15 µm. Adjusting the number of plating structures for filling the dimple below the second demarcation surface of the bridge structure is a further measure for improving reliability.

In an embodiment, a ratio between the narrowest vertical thickness of the bridge structure and the vertical thickness of the electrically insulating layer structure is in a range between 20% and 80%, in particular in a range between 30% and 50%. With the design rule corresponding to the mentioned ratio, it can be ensured on the one hand that the middle of the bridge structure is reliably connected without inclusions of voids, and that at the same time the shape of the bridge structure is appropriate for a subsequent substantially complete filling of dimples above and below the bridge structure with the electrically conductive bulk structures.

In an embodiment, the electrically conductive bridge structure is delimited by a first demarcation surface facing towards the first main surface and by a second demarcation surface facing towards the second main surface. Both demarcation surfaces may be preferably concave and may define the border between bridge structure and electrically conductive bulk structures.

In an embodiment, a thickness of the first electrically conductive layer structure and/or a thickness of the second electrically conductive layer structure is less than 5 µm, in particular is in a range between 2 µm and 4 µm. In particular with such small thicknesses, reliability issues of a component carrier may be specifically pronounced. However, when the above-described design rule concerning the minimum thickness of the bridge structure is fulfilled, also with relatively thin electrically conductive layer structures a high electric reliability may be achieved.

In an embodiment, the through hole is substantially X-shaped. For in-stance, such a substantial X-shape may be defined, referring to a cross-sectional view of the component carrier or a preform of the component carrier, by sidewall lines corresponding to two opposing vertical bows having their maxima facing each other in a central portion of the through hole. The shape of the through hole may hence also be denoted as the shape of a vertical bow tie or of a mirrored truncated cone structure. As will be described below in further detail referring to FIG. 1 and FIG. 2, a substantially X-shaped through hole may be obtained by combining a first laser shot from the front side or upper main surface of the electrically insulating layer structure followed by a single second shot from the back side or second main surface of the electrically insulating layer structure. In many cases, the subsequently formed bridge structure is located in the narrowest portion of the substantially X-shaped through hole. Such an X-shaped through hole can be manufactured with low effort, since only two laser shots are sufficient.

In another embodiment, the through hole has a first tapering portion extending from the first main surface, a second tapering portion extending from the second main surface and a central connection portion connecting the first tapering portion with the second tapering portion. In particular, the central connection portion may be a substantially cylindrical portion of the through hole. As will be described below referring to FIG. 3, a through hole with two opposing tapering portions connected by a for instance substantially circular cylindrical central connection portion can be accomplished by a first laser shot from the front side or first main surface of the electrically insulating layer structure followed by two laser shots from the back side or second main surface of the electrically insulating layer structure. As a consequence, the narrowest portion of the through hole may be widened which has a further positive impact on the reliability of the component carrier.

In an embodiment, the electrically insulating layer structure is a fully cured core. Thus, the material of the electrically insulating layer structure may be so that its resin is no longer capable of carrying out a cross-linking. In other words, the electrically insulating layer structure will not re-melt or become flowable during a laminate process by which exterior electrically conductive layer structures and/or electrically insulating layer structures may be laminated on the central layer stack with through hole. For instance, the electrically insulating layer structure may comprise resin (such as epoxy resin) with reinforcing particles (such as glass fibers or glass spheres), for instance may be FR4.

In an embodiment, the bridge structure is integrally connected with a (in particular simultaneously formed) plating layer which covers the sidewalls of the electrically insulating layer structure delimiting the through hole. In particular, such a bridge structure may be formed on a seed layer together with a plating layer. Preferably, the bridge structure is formed by firstly carrying out a seed layer formation by electroless deposition. As a result, a thin layer of electrically conductive material may cover the sidewalls of the through hole. Subsequently, a plating procedure (for instance galvanic plating) may be carried out so that the seed layer is covered with a thick layer of electrically conductive material which may be integrally connected with the substantially horizontal bridge structure. Thus, when the bridge structure is manufactured, it may form a substantially horizontal portion connecting opposing sidewalls and may be integrally connected with layer components covering the sidewalls of the electrically insulating layer structure delimiting the through hole. The bridge structure with connected plating layer may then have a substantially H shape.

In an embodiment, a lateral overhang of at least one of the first electrically conductive layer structure and the second electrically conductive layer structure beyond at least one sidewall of the electrically insulating layer structure delimiting the through hole is not more than 20 µm, in particular not more than 10 µm. This increases the electric reliability and keeps the risk of the formation of cracks and voids small. In the context of the present application, the term "overhang" may particularly denote a partial length of a respective one of the electrically conductive layer structures directly adjacent to the respective window over which partial length the electrically conductive layer structure extends laterally beyond (or hangs freely in a cantilever fashion) over the electrically insulating layer structure. Thus, the overhanging material of the respective electrically conductive layer structure may be locally not supported by material of the electrically insulating layer structure along the extension of the overhang due to the presence of a portion of the laser through hole in a pocket below the overhanging electrically conductive layer structure. What concerns the above statement that overhanging material may be locally not supported, it should be said that the overhang may relate to the substantially resin free area beneath the respective electrically conductive layer structure. However, a person skilled in the art will understand that some residue resin might be even present within a gap relating to the overhang. In order to quantitatively determine or measure the value of the overhang, the length of the substantially resin-free (wherein resin may refer to the electrically insulating layer structure) undercut directly under an overhanging electrically conductive layer structure may be measured (in particular even if it is not the most receding point or total relief below the overhanging electrically conductive layer structure, for example copper layer). In other words, for measuring the overhang, the undercut directly below the electrically conductive layer structure may be measured.

In an embodiment, different portions of the through hole taper with different steepness. A respective shallower or gently inclined exterior portion may be followed by a respective steeper interior portion on each of the two sides, wherein exterior and interior is to be understood to relate to the respective main surfaces of the electrically insulating layer structure. A correspondingly formed through hole extending through an electrically insulating layer structure may be efficiently filled with electrically conductive material such as plated copper, to thereby establish a vertical interconnect through the electrically insulating layer structure with high electric reliability.

In an embodiment, at least one of the first electrically conductive bulk structure and the second electrically conductive bulk structure is a plating structure. After the previously described plating procedure for forming the bridge structure together with the integrally connected plating layer, it is then possible to at least partially fill one or both dimples above and below the bridge structure with further electrically conductive material (preferably copper) forming the first electrically conductive bulk structure and/or the second electrically conductive bulk structure. This may be accomplished by a separate plating procedure following the previously completed plating procedure for forming the bridge structure including plating layer. As a result, the first electrically conductive bulk structure and/or the second electrically conductive bulk structure may be composed of one or more further plating layers which can be distinguished by an analysis of a cross-sectional view of the component carrier by visual inspection. Defining the number of plating procedures for forming the electrically conductive bulk structures is a simple and reliable possibility of filling a large portion of the dimples with further electrically conductive material.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper (or from another electrically conductive material), whereas the electrically insulating layer structures may comprise resin and/or glass fibers, so-called prepreg such as FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

In an embodiment, the at least one electrically insulating layer structure comprises at least one of the group consisting of resin (such as rein-forced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene)(Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier comprises at least one component which may be surface mounted on the component carrier and/or may be embedded in an interior thereof. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration.

In an embodiment, the component carrier is a laminate-type component carrier. In such an embodiment, the component carrier is a compound of multiple layer structures which are stacked and connected together by applying a pressing force and/or heat.

The substrate or interposer may consist of at least a layer of glass, Silicon (Si) or a photo-imagable or dry-etchable organic material like epoxy-based build-up films or polymer compounds like polyimide, polybenzoxazole, or benzocyclobutene.

The aspects defined above and further aspects of the embodiments of the invention are apparent from the examples of embodiment to be described hereinafter and are explained with reference to these examples of embodiment.

DETAILED DESCRIPTION OF ILLUSTRATED EMBODIMENTS

Figure 1:
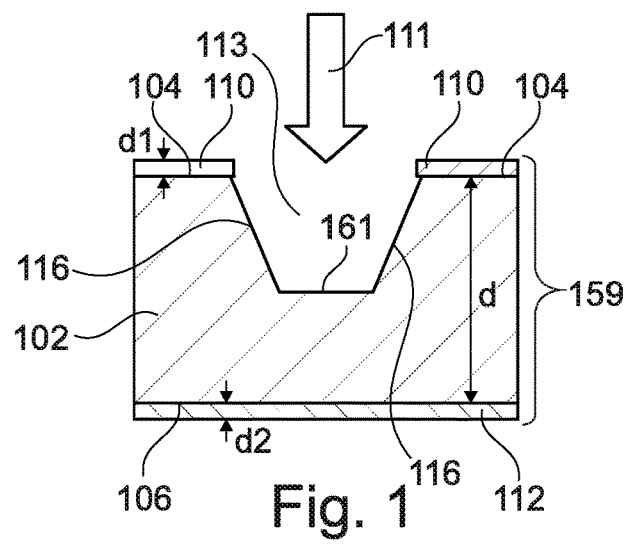
FIG. 1, FIG. 2 and FIG. 3 illustrate cross-sectional views of structures obtained during carrying out methods of manufacturing a component carrier with a through hole, shown in FIG. 2 and FIG. 3, by a multiple laser shot treatment from opposing sides according to an exemplary embodiment of the invention.

The illustrations in the drawings are schematically presented. In different drawings, similar or identical elements are provided with the same reference signs.

Before referring to the drawings exemplary embodiments will be described in further detail, some basic considerations will be summarized based on which exemplary embodiments of the invention have been developed.

According to an exemplary embodiment of the invention, a component carrier with a through hole filled with electrically conductive material is provided, wherein a horizontal bridge structure connecting opposing side-walls of a thin electrically insulating layer structure delimiting the through hole and having a vertical thickness of not more than 100 μm is preferably formed with a minimum bridge thickness of 20 μm, preferably 25 μm, or more. Experiments have shown that the reliability of the obtained component carrier is then high.

According to a preferred embodiment, a maximum and a minimum middle diameter criterion may be maintained after through hole laser drilling, and a minimum bridge thickness after electroplating, in particular strike plating or flash plating, may be adjusted to ensure reliable through hole bridging and good plating reliability. A reliable (preferably 100% reliable) bridging prior to via filling has turned out to be highly advantageous to ensure plating reliability. In a preferred embodiment, the middle diameter of the through hole should not be larger than 75 μm. It has also turned out to be preferable that a middle diameter of the through hole should not be smaller than 25 μm. Also, a minimum bridging thickness may be specified appropriately, in particular to be at least 20 μm or preferably at least 25 μm, to ensure proper (and preferably 100%) bridging. Descriptively speaking, a sufficient bridging thickness may be adjusted to ensure complete bridging, i.e. formation of a bridge of electrically conductive material connecting opposing sidewalls of the electrically insulating layer structure delimiting the through hole.

As a result, a proper component carrier can be obtained manufactured in accordance with through hole technology. Such a component carrier may in particular be advantageously used for embedding one or more components (such as a semiconductor chip), in particular in a center core configuration.

Very good results in terms of reliability of the manufactured component carrier can be obtained when the middle diameter is between 45 μm and 75 μm and the minimum bridge thickness is at least 25 μm. This may ensure a reliable and complete formation of a bridge structure by plating, where the bridge structure connects opposing sidewalls of the electrically insulating layer structure delimiting the through hole in particular in a narrowest portion of the through hole. By ensuring a complete bridging, the risk of inclusion and/or voids and the risk of a reliability failure of the component carrier can be rendered very small.

Figures 2, 2A:
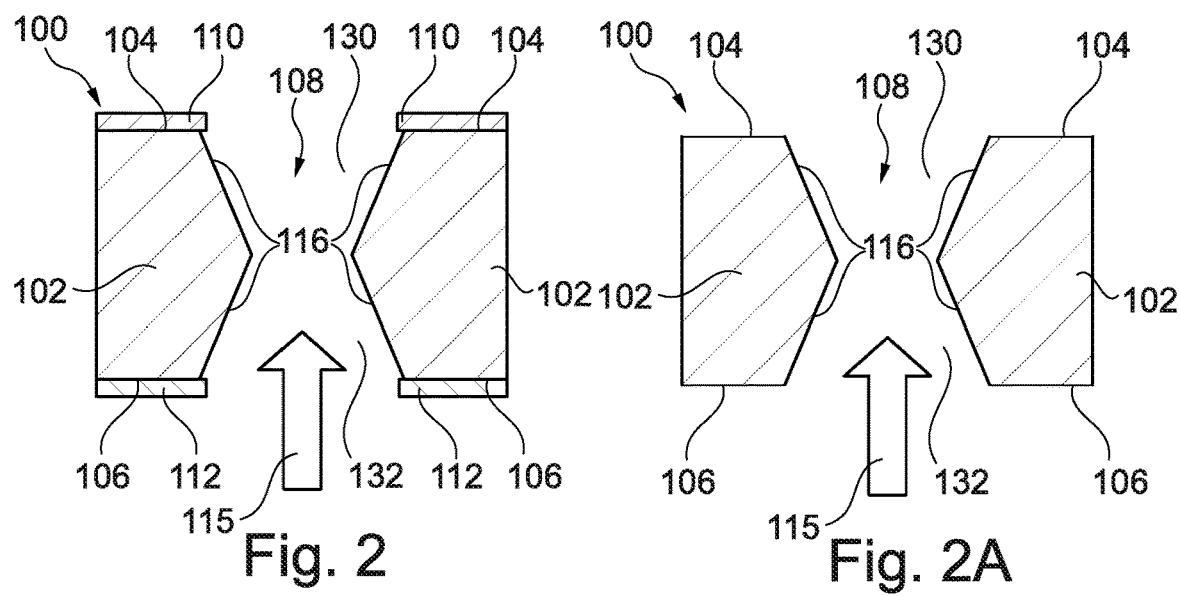
FIG. 2A shows a cross-sectional view of a preform of a component carrier according to another exemplary embodiment relating to FIG. 2 but with the difference that no electrically conductive layer structures are provided on the opposing main surfaces of the electrically insulating layer structure at the time of forming the through hole.
Figure 3:
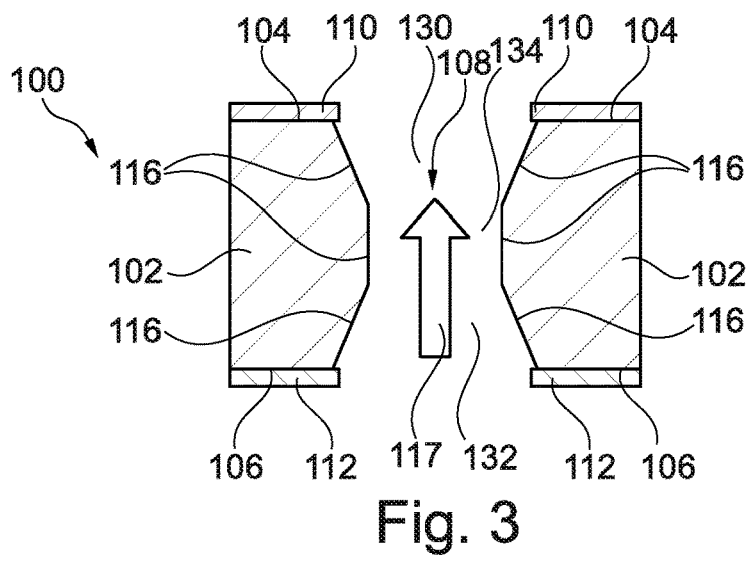

FIG. 1 to FIG. 3 illustrate cross-sectional views of structures obtained during carrying out methods of manufacturing a component carrier 100 with a through hole 108, shown in FIG. 2 and FIG. 3, by a multiple laser shot treatment from opposing sides according to an exemplary embodiment of the invention.

As shown in FIG. 1, starting point of the manufacturing method is a stack 159 comprising a first electrically conductive layer structure 110 on a first main surface 104 of an electrically insulating layer structure 102. The stack 159 furthermore comprises a second electrically conductive layer structure 112 on a second main surface 106 of the electrically insulating layer structure 102.

For example, the electrically insulating layer structure 102 may comprise resin (such as epoxy resin), optionally additionally comprising reinforcing particles such as glass fibers, glass particles or other filler particles. For instance, the material of the electrically insulating layer structure 102 may be prepreg. The electrically conductive layer structures 110, 112 may be copper layers, in particular copper foils. For instance, a thickness d of the electrically insulating layer structure 102 may be below 60 μm, and a thickness d1, d2 of the electrically conductive layer structures 110, 112 may be each less than 5 μm.

In order to obtain the layer structure shown in FIG. 1, the front side or first main surface 104 of the electrically insulating layer structure 102 covered with the first electrically conductive layer structure 110 may be made subject of a first laser treatment. For this purpose, a first laser shot 111 can be carried out to form a through hole or window in the first electrically conductive layer structure 110 and a blind hole 113 in the electrically insulating layer structure 102. The blind hole 113 is delimited by sidewalls 116 and a bottom wall 161 of the electrically insulating layer structure 102.

Care should be taken that the laser energy and duration during the first shot 111 is not excessive so that the blind hole 113 does not reach up to the second electrically conductive layer structure 112. Otherwise, undesired effects such as a reflection of laser light, etc. may occur. Descriptively speaking, the blind hole 113 may later form a first tapering portion 130 of the through hole 108, as shown in FIG. 2 or FIG. 3.

Referring to FIG. 2, formation of the through hole 108 may be completed by carrying out, after the first laser drilling from the first main surface 104 with one laser shot according to FIG. 1, a second laser drilling from the second main surface 106 with one laser shot. As a result of this back-side laser drilling, a through hole or window is formed in the second electrically conductive layer structure 112, and the blind hole 113 is extended until it forms through hole 108 extending between first main surface 104 and second main surface 106 of the electrically insulating layer structure 102. As shown in FIG. 2, the through hole 108 has first tapering portion 130 extending from the first main surface 104 and has second tapering portion 132 extending from the second main surface 106. The first tapering portion 130 and the second tapering portion 132 meet each other at a narrowest portion in the center of the through hole 108.

In order to obtain the structure shown in FIG. 2, the structure obtained after carrying out the procedure described referring to FIG. 1 may be made subject to a second laser shot 115 from the back side or second main surface 106 of the electrically insulating layer structure 102. As a result, a through hole is formed through the second electrically conductive layer structure 112 and additional material of the electrically insulating layer structure 102 is removed by the laser energy until the previously formed blind hole 113 is extended from the bottom side into through hole 108. This through hole 108 according to FIG. 2 has a substantially X shape and can be directly subsequently made subject to a procedure of being filled with electrically conductive filling medium such as copper (see FIG. 6). Formation of the through hole 108 according to FIG. 2 is highly efficient and is therefore particularly appropriate for processing on industrial scale, since it may be sufficient to use only two laser shots for its formation.

Alternatively, it is possible to carry out a further laser drilling procedure from the back side before filling the through hole 108 with electrically conductive filling medium such as copper. The latter mentioned embodiment will now be described referring to FIG. 3.

Referring to FIG. 3, the shape of the through hole 108 is modified in particular in the central portion thereof by carrying out, after the first laser drilling from the first main surface 104 with one laser shot according to FIG. 1 and after carrying out the second laser drilling from the second main surface 106 according to FIG. 2, a third laser shot 117 from the backside.

Hence, alternatively to the procedure described referring to FIG. 2, it is also possible to carry out an additional third laser shot 117 from the back side or second main surface 106 of the electrically insulating layer structure 102 to refine the shape of the through hole 108. Such a third laser shot 117 may remove material in particular in the central portion of the electrically insulating layer structure 102 so as to form a substantially cylindrical central portion 134 sandwiched between the two tapering portions 130, 132. Although the manufacturing procedure for forming the through hole 108 with the shape according to FIG. 3 requires an additional third laser shot 117 compared to FIG. 2, this shape may further improve the reliability of the manufactured component carrier 100.

Figure 4:
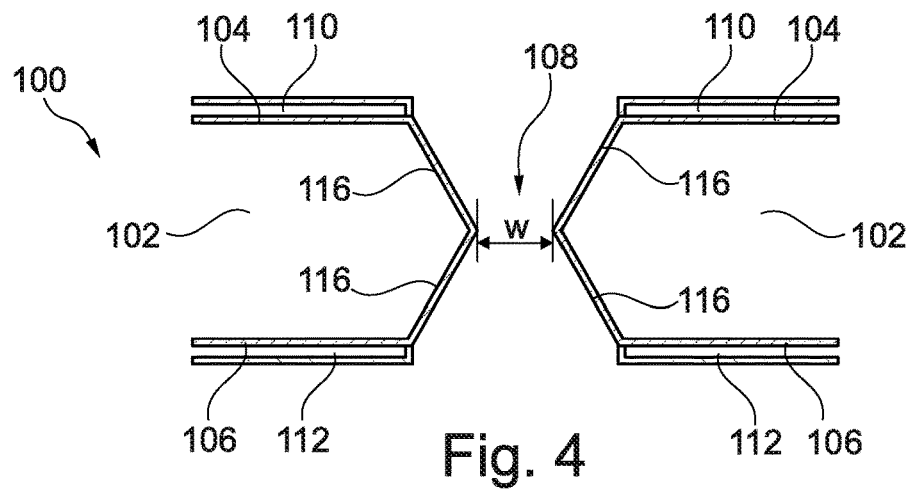
FIG. 4 shows a structure similar to FIG. 2 illustrating an advantageous dimensioning of a narrowest portion of the through hole.

FIG. 4 illustrates a structure similar to FIG. 2 and shows an advantageous dimensioning of a narrowest portion of the through hole 108. As shown in FIG. 4, the result of the manufacturing procedure described referring to FIG. 1 and FIG. 2 is a through hole 108 with a substantially X-shape and having a narrowest width w between two opposing sidewalls 116 of the through hole 108. Of course, different sizes, depth values of V-shaped or truncated cones of openings from each side are possible.

Figure 5:
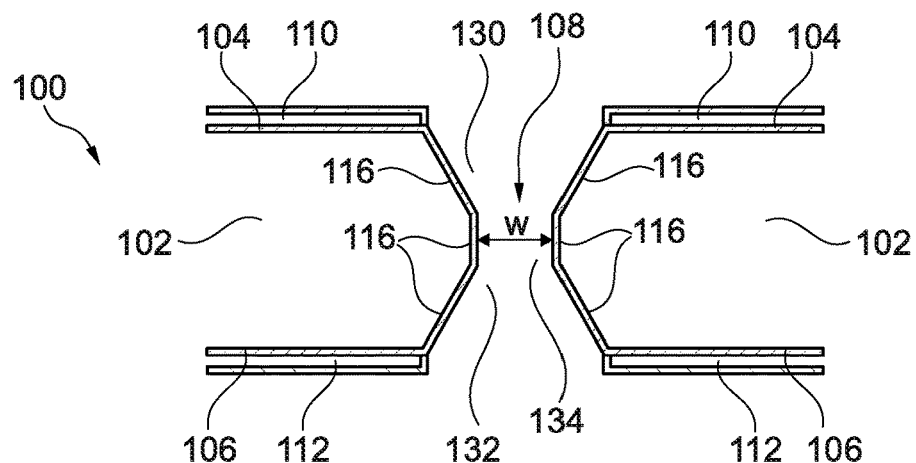
FIG. 5 shows a structure similar to FIG. 3 illustrating an advantageous dimensioning of a narrowest portion of the through hole.

FIG. 5 illustrates a structure similar to FIG. 3 and shows an advantageous dimensioning of a narrowest portion of the through hole 108. As shown in FIG. 5, the manufacturing procedure described referring to FIG. 1, FIG. 2 and FIG. 3 results in a through hole 108 with a substantially circular cylindrical central section 134 having a narrowest width w.

Figure 6:
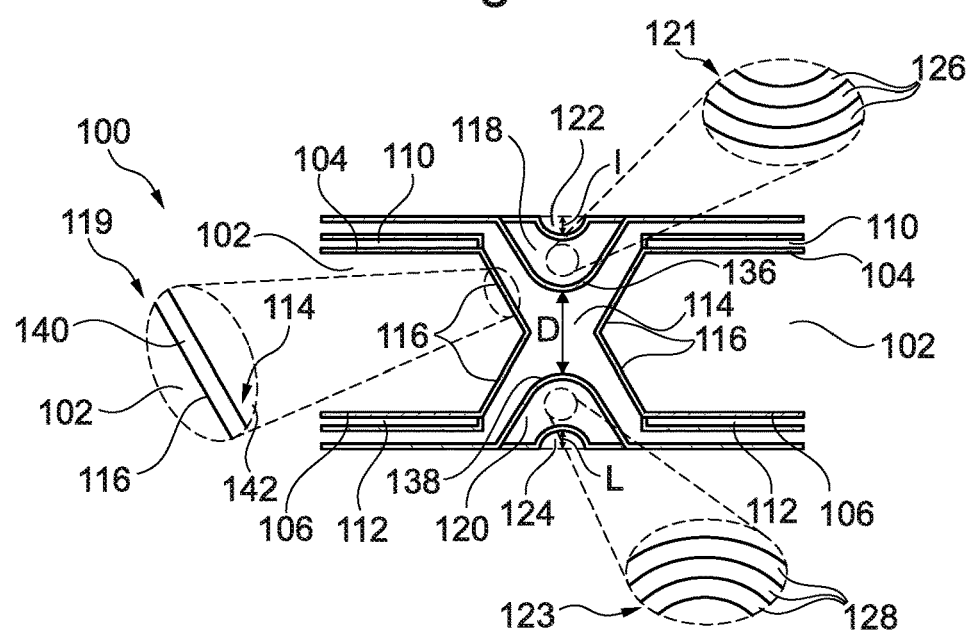
FIG. 6 shows a structure similar to FIG. 4, but after filling the through hole with electrically conductive filling material, and illustrating an advantageous dimensioning of various structural parameters of the through hole.

FIG. 6 illustrates a component carrier 100 according to an exemplary embodiment of the invention formed based on a structure similar to FIG. 4, and obtained after filling the through hole 108 with electrically conductive filling material (composed of various sections, as described below). An advantageous dimensioning of various structural parameters of the through hole 108 and its electrically conductive filling will be explained as well.

In order to obtain the component carrier 100 shown in FIG. 6, the through hole 108 according to FIG. 2 or FIG. 4 is made subject to a first procedure of filling it with an electrically conductive filling medium such as copper. In order to accomplish this, it is preferable to firstly carry out an electroless deposition procedure to thereby form a thin seed layer 140 of copper directly covering the dielectric sidewalls 116 of the electrically insulating layer structure 102 delimiting the through hole 108. This can be seen in a detail 119 in FIG. 6. A thickness of the seed layer 140 may be for instance 0.5 μm. However, it is also possible that the seed layer has a thickness above 1 μm and/or that several cumulative seed layers are provided. For example, a thickness of a seed layer or a cumulative thickness of a plurality of seed layers may be in a range between 0.5 μm and 5 μm. When multiple seed layers are provided, they may comprise an organic (for instance polymer) layer, a palladium layer, and/or a copper layer.

Subsequently, further electrically conductive material (such as copper) may be deposited on the seed layer 140 by a plating procedure, in particular by galvanic plating. Thus, the sidewalls 116 as well as the electrically conductive layer structures 110, 112 are covered by a thicker plating layer 142 of electrically conductive filling medium such as copper. For instance, the plating layer 142 may have a thickness of 10 μm.

The plating procedure is continued so as to form an electrically conductive bridge structure 114 with a substantially horizontal portion connecting opposing sidewalls 116 of the electrically insulating layer structure 102 delimiting the through hole 108. The plating layer 142 and the bridge structure 114 may form an integral substantially H-shaped structure. As shown, the electrically conductive bridge structure 114 is formed to be delimited by an upper first demarcation surface 136 oriented upwardly or facing towards the first main surface 104 and by a lower second demarcation surface 138 orientated downwardly or facing towards the second main surface 106. Forming the electrically conductive bridge structure 114 may be carried out by galvanic plating, preferably following the formation of the seed layer 140 described above. The bridge structure 114 forms a substantially horizontal bridge between opposing sidewalls 116 of the electrically insulating layer structure 102 delimiting the through hole 108.

Thus, by continuing the plating procedure, the substantially horizontal bridge structure 114 is formed in a narrowest portion of the through hole 108 and connecting the opposing sidewalls 116. A concave upper limiting surface corresponds to the first demarcation surface 136, whereas a lower concave limiting surface of the bridge structure 114 corresponds to the second demarcation surface 138.

The through hole 108 is therefore filled with a substantially H-shaped electrically conductive structure formed by the bridge structure 114 in combination with four arms extending therefrom in the cross-sectional view of FIG. 6, corresponding to the plating layers 142.

Still referring to FIG. 6, a first electrically conductive bulk structure 118 filling a major part between the first demarcation surface 136 and the first main surface 104 and a second electrically conductive bulk structure 120 filling a major part between the second demarcation surface 138 and the second main surface 106 are formed. This can be done by carrying out one or more further galvanic plating procedures following the previous plating procedure of forming the bridge structure 114. As shown in a detail 121, the first electrically conductive bulk structure 118 is composed of a plurality of first plating layers 126 formed in subsequent first plating stages. As illustrated correspondingly in a detail 123, the second electrically conductive bulk structure 120 is composed of a plurality of second plating layers 128 formed in subsequent second plating stages. Thus, the component carrier 100 according to FIG. 6 can be obtained by carrying out one or more further plating procedures. Thereby, the bulk structures 118, 120, which may for instance consist of copper, can be obtained.

In the shown embodiment, a small dip 122, 124, respectively, remains at an upper side or a lower side of the shown component carrier 100. In other embodiments, the bulk structures 118, 120 fill the remaining recesses above the first demarcation surface 136 and below the second demarcation surface 138 almost completely. It should be said that it is well-known by a skilled person that the demarcation surfaces 136, 138 are clearly visible when imaging a cross-section of the component carrier 100.

As a result of the described manufacturing procedure, a component carrier 100 according to an exemplary embodiment of the invention with high electric reliability is obtained. The high reliability results in particular from a specific selection of a combination of parameters, shown in FIG. 1 to FIG. 6. A highly advantageous aspect of parameter selection is the combination of the small vertical thickness d of the electrically insulating layer structure 102 of not more than 200 μm, for instance even below 60 μm, and a narrowest vertical thickness D of the bridge structure 114 of at least 20 μm, preferably at least 25 μm. At the same time, it is advantageous if the vertical thickness D of the bridge structure 114 is not more than 40 μm. A narrowest horizontal width w of the through hole 108 should be preferably not more than 75 μm. It has furthermore turned out as advantageous when the narrowest horizontal width w of the through hole 108 is not less than 45 μm. In case the first electrically conductive bulk structure 118 has a first dip 122 substantially at the level of the first main surface 104, it is advantageous that the first dip 122 has a depth I of less than 15 μm. This also holds for the depth L of the second dip 124 of the second electrically conductive bulk structure 120.

In the following, the mentioned several design parameters will be described in further detail which may contribute to a high reliability of the component carrier 100 shown in FIG. 6. Such a high reliability corresponds to the fact that the tendency of crack formation in an interior of the through hole 108 is small. Also, the tendency of the formation of voids in an interior of the electrically conductive filling medium filling a major portion of the through hole 108 is small, which has a positive impact on the reliable conduction of electric signals or electric power through the copper filled through hole 108. It should be mentioned that the reliability issues are particularly pronounced at a small thickness of the electrically insulating layer structure 102, which may for instance be a fully cured core of FR4 material. Since the thickness d is not more than 200 μm in the shown embodiments, the reliability issues are pronounced. However, the following measures may be taken to overcome reliability issues even with thin cores having a thickness d≤100 μm.

Referring to FIG. 6, it is preferred that the smallest vertical thickness D of the bridge structure 114 is at least 20 μm. If this design rule is not fulfilled, there is a risk that the middle portion of the bridge structure 114 is not properly connected, and there is the risk of the inclusion of voids in this region. At the same time, the smallest vertical thickness D of the bridge structure 114 should be not more than 40 μm. Otherwise, the dimples above demarcation surface 136 and below demarcation surface 138 may become too shallow so that a subsequent procedure of filling these dimples by plating during formation of electrically conductive bulk structures 118, 120 may create an undesired or bad shape.

Furthermore, and now referring in particular to FIG. 4 and FIG. 5, the narrowest horizontal width w should be in a range between 30 μm and 100 μm, preferably in a range between 45 μm and 75 μm. If the width w becomes larger, bridge formation may cause problems. If the value of the width w becomes smaller, there may be an excessive risk of cracks. Although the exact values may depend a little bit on the thickness d of the electrically insulating layer structure 102, because the plated copper has to move over a larger distance to reach its destination, this can be adjusted by a proper selection of chemistry. The mentioned ranges are thus valid substantially independently of the thickness d of the electrically insulating layer structure 102, provided that it is a thin core.

Concluding, with the mentioned design rules and parameters, a proper reliability of the component carrier 100 can be obtained.

FIG. 2A shows a cross-sectional view of a preform of a component carrier 100 according to another exemplary embodiment relating to FIG. 2 but with the difference that no electrically conductive layer structures 110, 112 are provided on the opposing main surfaces of the electrically insulating layer structure 102 at the time of forming the through hole 108.

A main difference between the embodiment of FIG. 1 to FIG. 6 and the embodiment of FIG. 2A is that, according to FIG. 2A, the main surfaces 104, 106 of the electrically insulating layer structure 102 have not been covered by electrically conductive layer structures 110, 112 at the time of forming the through hole 108. Thus, the manufacturing method relating to the embodiment of FIG. 2A comprises forming the through hole 108 in the electrically insulating layer structure 102 while the main surfaces 104, 106 of the electrically insulating layer structure 102 have not been covered by an electrically conductive layer structure 110, 112 such as a copper foil.

What concerns the subsequent filling of the through hole 108 and coverage of the main surfaces 104, 106 with an electrically conductive filling medium, this may be carried out by the formation of an optional seed layer 140, the subsequent optional formation of a plating layer (not shown) covering at least part of the main surfaces 104, 106 and of the sidewalls 112 of the through hole 108, the subsequent formation of a bridge structure 114 bridging opposing sidewalls 116 and having for instance a substantially H-shape, and an optional filling of one or both volumes above and/or below the bridge structure 114 by one or more bulk structures 118, 120 (which may be further plating structures or sequences of plating structures). Reference is made to the corresponding description of FIG. 6.

Apart from this difference, the above disclosure concerning FIG. 1 to FIG. 6 also applies to FIG. 2A. Also, through hole formation according to FIG. 3 can be carried out without copper foils on the electrically insulating layer structure 102.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
an electrically insulating layer structure having a first main surface and a second main surface;
a through hole extending through the electrically insulating layer structure between the first main surface and the second main surface;
an electrically conductive bridge structure connecting opposing sidewalls of the electrically insulating layer structure delimiting the through hole; and
a first electrically conductive bulk structure filling at least part of a volume above the electrically conductive bridge structure;
wherein a vertical thickness of the electrically insulating layer structure is not more than 200 μm and a narrowest vertical thickness of the bridge structure is at least 20 μm;
wherein the first electrically conductive bulk structure has a first dip at the level of the first main surface, the first dip having a depth of less than 15 μm;
wherein the first electrically conductive bulk structure is composed of a plurality of first plating layers formed in subsequent first plating stages.

2. The component carrier according to claim 1, further comprising:
a first electrically conductive layer structure on the first main surface; and
a second electrically conductive layer structure on the second main surface.

3. The component carrier according to claim 1, comprising at least one of the following features:
wherein the vertical thickness of the electrically insulating layer structure is in a range between 40 μm and 60 μm;
wherein the narrowest vertical thickness of the bridge structure is at least 25 μm;
wherein the narrowest vertical thickness of the bridge structure is not more than 40 μm;
wherein a narrowest horizontal width of the through hole is not more than 100 μm;
wherein a narrowest horizontal width of the through hole is not less than 30 μm.

4. The component carrier according to claim 1, further comprising:
a second electrically conductive bulk structure filling at least part of a volume below the electrically conductive bridge structure.

5. The component carrier according to claim 4, wherein the second electrically conductive bulk structure has a second dip at the level of the second main surface, the second dip having a depth of less than 15 μm.

6. The component carrier according to claim 4, wherein the second electrically conductive bulk structure is composed of a plurality of second plating layers formed in subsequent second plating stages.

7. The component carrier according to claim 1, wherein a ratio between the narrowest vertical thickness of the bridge structure and the vertical thickness of the electrically insulating layer structure is in a range between 20% and 80%.

8. The component carrier according to claim 1, wherein the electrically conductive bridge structure is delimited by a first demarcation surface facing towards the first main surface and by a second demarcation surface facing towards the second main surface.

9. The component carrier according to claim 2, wherein a thickness of the first electrically conductive layer structure and/or a thickness of the second electrically conductive layer structure is less than 5 μm.

10. The component carrier according to claim 1, wherein the through hole has a first tapering portion extending from the first main surface, a second tapering portion extending from the second main surface and a central connection portion connecting the first tapering portion with the second tapering portion.

11. The component carrier according to claim 1, comprising at least one of the following features:
   wherein the through hole is substantially X-shaped;
   wherein the electrically insulating layer structure is a fully cured core.

12. The component carrier according to claim 1, wherein the bridge structure is integrally connected with a plating layer which covers the sidewalls.

13. The component carrier according to claim 2, wherein a lateral overhang of at least one of the first electrically conductive layer structure and the second electrically conductive layer structure beyond at least one sidewall of the electrically insulating layer structure delimiting the through hole is not more than 20 μm.

14. The component carrier according to claim 1, wherein different portions of the through hole taper with different steepness.

15. The component carrier according to claim 1, comprising at least one of the following features:
   at least one component embedded in and/or surface mounted on the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
   wherein at least one of the electrically conductive layer structures comprises at least one of a group of materials consisting of copper, aluminum, nickel, silver, gold, palladium, and tungsten, any of the group of materials being coated with graphene;
   wherein the electrically insulating layer structure comprises at least one of a group consisting of resin, reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
   wherein the component carrier is shaped as a plate;
   wherein the component carrier is configured as one of a group consisting of a printed circuit board, and a substrate;
   wherein the component carrier is configured as a laminate-type component carrier.

16. A method of manufacturing a component carrier, comprising:
   forming a through hole extending between a first main surface and a second main surface of an electrically insulating layer structure;
   forming an electrically conductive bridge structure connecting opposing sidewalls of the electrically insulating layer structure delimiting the through hole;
   filling at least part of a volume above the electrically conductive bridge structure with a first electrically conductive bulk structure;
   wherein a vertical thickness of the electrically insulating layer structure is not more than 200 μm and a narrowest vertical thickness of the bridge structure is at least 20 μm;
   wherein the first electrically conductive bulk structure has a first dip at the level of the first main surface, the first dip having a depth of less than 15 μm;
   wherein the first electrically conductive bulk structure is composed of a plurality of first plating layers formed in subsequent first plating stages.

17. The method according to claim 16, further comprising:
   forming a first electrically conductive layer structure on the first main surface; and/or
   forming a second electrically conductive layer structure on the second main surface.

18. The method according to claim 16, wherein forming the through hole in the electrically insulating layer structure includes forming the through hole while one or both of the main surfaces of the electrically insulating layer structure is covered by an electrically conductive layer structure.

* * * * *